US012206068B2

(12) United States Patent
Kataoka et al.

(10) Patent No.: US 12,206,068 B2
(45) Date of Patent: Jan. 21, 2025

(54) GALLIUM-SUBSTITUTED SOLID ELECTROLYTE MATERIAL, AND ALL-SOLID-STATE LITHIUM ION SECONDARY BATTERY

(71) Applicant: NATIONAL INSTITUTE OF ADVANCED INDUSTRIAL SCIENCE AND TECHNOLOGY, Tokyo (JP)

(72) Inventors: Kunimitsu Kataoka, Tsukuba (JP); Junji Akimoto, Tsukuba (JP); Yuso Ishida, Tokyo (JP); Tomoki Ariga, Tokyo (JP)

(73) Assignee: NATIONAL INSTITUTE OF ADVANCED INDUSTRIAL SCIENCE AND TECHNOLOGY, Tokyo (JP)

( * ) Notice: Subject to any disclaimer, the term of this patent is extended or adjusted under 35 U.S.C. 154(b) by 465 days.

(21) Appl. No.: 17/642,210

(22) PCT Filed: Jun. 26, 2020

(86) PCT No.: PCT/JP2020/025295
§ 371 (c)(1),
(2) Date: Mar. 10, 2022

(87) PCT Pub. No.: WO2021/053923
PCT Pub. Date: Mar. 25, 2021

(65) Prior Publication Data
US 2022/0320578 A1  Oct. 6, 2022

(30) Foreign Application Priority Data
Sep. 19, 2019 (JP) .................. 2019-170802

(51) Int. Cl.
*H01M 10/0562* (2010.01)
*C01G 25/00* (2006.01)
(Continued)

(52) U.S. Cl.
CPC ...... *H01M 10/0562* (2013.01); *C01G 25/006* (2013.01); *C30B 13/28* (2013.01);
(Continued)

(58) Field of Classification Search
CPC ......... H01M 10/0562; H01M 10/0525; H01M 2300/0077; C01P 200/30; C01P 200/50;
(Continued)

(56) References Cited

U.S. PATENT DOCUMENTS

2017/0324079 A1* 11/2017 Kataoka ............ H01M 10/0525
2019/0245178 A1* 8/2019 Cao .................. H01M 10/4235
2019/0341651 A1 11/2019 Kataoka et al.

FOREIGN PATENT DOCUMENTS

CN  108352566 A  7/2018
CN  109148948 A  1/2019
(Continued)

OTHER PUBLICATIONS

International Search Report issued in PCT/JP2020/025295; mailed Aug. 25, 2020.
(Continued)

*Primary Examiner* — Jane J Rhee
(74) *Attorney, Agent, or Firm* — Studebaker & Brackett PC

(57) ABSTRACT

Provided is a novel solid electrolyte material of high density and high ionic conductivity, and an all-solid-state lithium ion secondary battery that utilizes the solid electrolyte material. The solid electrolyte material has a chemical composition represented by $Li_{7-3x}Ga_xLa_3Zr_2O_{12}$ (0.08≤x<0.5), has a relative density of 99% or higher, belongs to space group I-43d,
(Continued)

in the cubic system, and has a garnet-type structure. The lithium ion conductivity of the solid electrolyte material is $2.0 \times 10^{-3}$ S/cm or higher. The solid electrolyte material has a lattice constant a such that 1.29 nm≤a≤1.30 nm, and lithium ions occupy the 12a site, the 12b site and two types of 48e site, and gallium occupies the 12a site and the 12b site, in the crystal structure. The all-solid-state lithium ion secondary battery has a positive electrode, a negative electrode, and a solid electrolyte. The solid electrolyte is made up of the solid electrolyte material of the present invention.

11 Claims, 13 Drawing Sheets

(51) Int. Cl.
  *C30B 13/28*    (2006.01)
  *C30B 15/20*    (2006.01)
  *C30B 29/28*    (2006.01)
  *H01M 10/0525*  (2010.01)

(52) U.S. Cl.
  CPC .............. *C30B 15/20* (2013.01); *C30B 29/28* (2013.01); *H01M 10/0525* (2013.01); *C01P 2002/30* (2013.01); *C01P 2002/50* (2013.01); *C01P 2002/72* (2013.01); *C01P 2002/74* (2013.01); *C01P 2002/76* (2013.01); *C01P 2002/77* (2013.01); *C01P 2006/10* (2013.01); *C01P 2006/40* (2013.01); *H01M 2300/0077* (2013.01)

(58) Field of Classification Search
  CPC ..... C01P 200/72; C01P 200/74; C01P 200/76; C01P 200/77; C01P 2006/10; C01P 2006/40
  See application file for complete search history.

(56) References Cited

FOREIGN PATENT DOCUMENTS

| | | |
|---|---|---|
| JP | 2011-195373 A | 10/2011 |
| WO | 2016/068040 A1 | 5/2016 |
| WO | 2017/130622 A1 | 8/2017 |

OTHER PUBLICATIONS

Reinhard Wagner et al., "Crystal Structure of Garnet-Related Li-Ion Conductor Li7-3xGaxLa3Zr2O12: Fast Li-Ion Conduction Caused by a Different Cubic Modification?", Chemistry of Materials, 2016, vol. 28, pp. 1861-1871.

Lars Robben et al., "Symmetry reduction due to gallium substitution in the garnet Li6.43(2)Ga0.52(3)La2.67(4)Zr2O12", Crystallographic Communications, 2016, E72, pp. 287-289.

International Preliminary Report On Patentability and Written Opinion issued in PCT/JP2020/025295; issued Mar. 15, 2022.

Randy Jalem et al., "Effects of Gallium Doping in Garnet-Type Li 7 La 3 Zr 2 O 12 Solid Electrolytes", Chemistry of Materials, vol. 27, No. 8, Apr. 17, 2015, pp. 2821-2831.

Kubicek Markus et al., "Oxygen Vacancies in Fast Lithium-Ion Conducting Garnets", Chemistry of Materials, vol. 29, No. 17, Sep. 12, 2017, pp. 7189-7196.

\* cited by examiner

GALLIUM-SUBSTITUTED SOLID ELECTROLYTE MATERIAL, AND ALL-SOLID-STATE LITHIUM ION SECONDARY BATTERY

TECHNICAL FIELD

The present invention relates to a gallium-substituted solid electrolyte material having high density and high ionic conductivity, and to an all-solid-state lithium ion secondary battery that utilizes this solid electrolyte material.

BACKGROUND ART

Lithium ion secondary batteries boast higher energy densities, and can be operated at higher potentials, than secondary batteries such as nickel cadmium batteries and nickel-metal hydride batteries; accordingly, lithium ion secondary batteries are widely used in small information devices such as mobile phones and laptops. Given that the weight and size lithium ion secondary batteries can be readily reduced, recent years have witnessed a growing demand for such batteries, as secondary batteries for hybrid vehicles and electric vehicles. With safety in mind, research and development are being conducted on all-solid-state lithium ion secondary batteries, which do not utilize flammable electrolyte solutions. The solid electrolytes used in all-solid-state lithium ion secondary batteries are required to exhibit high ionic conductivity.

Materials having a cubic garnet-type structure have been reported as having high ionic conductivity (see for instance Patent Document 1), and there is ongoing research and development on materials having this structure. It has been reported in particular that materials having a chemical composition $Li_{7-x}La_3Zr_{2-x}Ta_xO_{12}$ exhibit high ionic conductivity in the vicinity of x=0.5. In order to realize high lithium ion conductivity it is necessary that grain boundary resistance or interfacial resistance be reduced as much as possible, and hence a solid material is desirable herein that is a high-density molded body. A solid material as the high-density molded body allows preventing the occurrence of short-circuits between the positive and negative electrodes in the charging/discharging process, and moreover can be sliced thinly; as a result, this allows for future reductions in the size of all-solid-state lithium ion secondary batteries. It is however known that these materials having a cubic garnet-type structure are difficult to sinter, which makes it difficult to produce a high-density molded body.

Reports have been recently forthcoming on the growth of $Li_{7-x}La_3Zr_{2-x}Ta_xO_{12}$ and $Li_{7-x}La_3Zr_{2-x}Nb_xO_{12}$ single crystals, having a garnet-type structure, in accordance with a melting method (see for instance Patent Documents 2 and 3).

As recently reported, a sintered compact of gallium-substituted $Li_{7-3x}Ga_xLa_3Zr_2O_{12}$ having a cubic garnet-type structure has been produced that exhibits high lithium ion conductivity (see for instance Non-Patent Documents 1 and 2), but no report is extant on the production of a single crystal relying on a melting method.

In order to realize high lithium ion conductivity it is necessary that grain boundary resistance or interfacial resistance be reduced as much as possible, and hence a solid material is desirable herein that is a high-density molded body. Moreover, a high-density molded body in the form of a single crystal is not affected by grain boundaries, which is accordingly expected to translate into high lithium ion conductivity.

CITATION LIST

Patent Document

Patent Document 1: Patent Publication JP-A-2011-195373
Patent Document 2: WO 2016/068040
Patent Document 3: WO 2017/130622

Non-Patent Document

Non-Patent Document 1: Chemistry Materials, 28, 1861-1871 (2016)
Non-Patent Document 2: Crystallographic Communications, E72, 287-289, (2016)

SUMMARY

Technical Problem

It is an object of the present invention, arrived at in the light of the above considerations, to provide a novel gallium-substituted solid electrolyte material of high density and high lithium ion conductivity, and to provide an all-solid-state lithium ion secondary battery that utilizes this gallium-substituted solid electrolyte material.

Solution to Problem

The inventors found that a single-crystal rod of high-density $Li_{7-3x}Ga_xLa_3ZrO_{12}$ (0.08≤x<0.5) can be produced by molding polycrystalline $Li_{(7-3x)y}Ga_{xz}La_3Zr_2O_{12}$ (0.08≤x<0.5, 1.1≤y≤1.4, 1.6≤z≤3.3) to a rod shape, followed by melting and quenching of this polycrystal in accordance with the FZ method, by infrared light condensing heating.

The solid electrolyte material of the present invention has a chemical composition represented by $Li_{7-3x}Ga_xLa_3Zr_2O_{12}$ (0.08≤x<0.5), a relative density of 99% or higher, belongs to the cubic system, and has a garnet-type structure. The solid electrolyte material of the present invention may have a lithium ion conductivity of $2.0\times10^{-3}$ S/cm or higher. The solid electrolyte material of the present invention may have a lattice constant a such that 1.29714nm≤a≤1.30433 nm. The single-crystal solid electrolyte material of the present invention may be grown through melting of a material such that lithium ions occupy the 12a site (coordinates x=0.75, y=0.625, z=0), the 12b site (coordinates x=0.75, y=0.125, z=0), two types of 48e (coordinates x=0.6678, y=0.5607, z=0.1735, and coordinates x=0.6970, y=0.5738, z=0.0948), and gallium occupies the 12a site (coordinates x=0.75, y=0.625, z=0) and the 12b site (coordinates x=0.75, y=0.125, z=0) in the crystal structure. This is a new substance that has a different crystal structure, and different lithium ion arrangement in the crystal structure, than those reported to date. Preferably, the solid electrolyte material of the present invention has a relative density of 100%. In a case where the composition ratio x of gallium is 0.5 or higher, gallium occupies lanthanum sites, as in Non-Patent Document 2, and accordingly a substance is achieved that has a crystal structure different from that of the present invention.

In a method for producing a solid electrolyte material of the present invention that has a chemical composition represented by $Li_{7-3x}Ga_xLa_3Zr_2O_{12}$ (0.08≤x<0.5), a relative density of 99% or higher, belongs to the cubic system, and has a garnet-type structure, there is formed a molten portion through melting of at least part of a starting material the chemical composition whereof is represented by $Li_{(7-3)y}Ga_{xz}La_3Zr_2O_{12}$ (0.08≤x<0.5, 1.1≤y≤1.4, 1.6≤Z≤3.3), and the molten portion is caused to move at a moving speed of 8 mm/h or higher. In the method for producing a solid electrolyte material of the present invention, the growth rate is preferably from 8 mm/h to 19 mm/h. In a method for producing the solid electrolyte material of the present invention in accordance with the FZ method, preferably a rod-like starting material is melted while being caused to rotate at a rotational speed of 30 rpm or higher, and more preferably at a rotational speed of from 30 rpm to 60 rpm, in a plane perpendicular to a longitudinal direction.

The all-solid-state lithium ion secondary battery of the present invention has a positive electrode, a negative electrode, and a solid electrolyte, the solid electrolyte being made up of the solid electrolyte material of the present invention.

Advantageous Effects of Invention

The present invention allows obtaining a gallium-substituted solid electrolyte material having high density and high ionic conductivity, and an all-solid-state lithium ion secondary battery that utilizes this solid electrolyte material.

DESCRIPTION OF EMBODIMENTS

Figure 1:
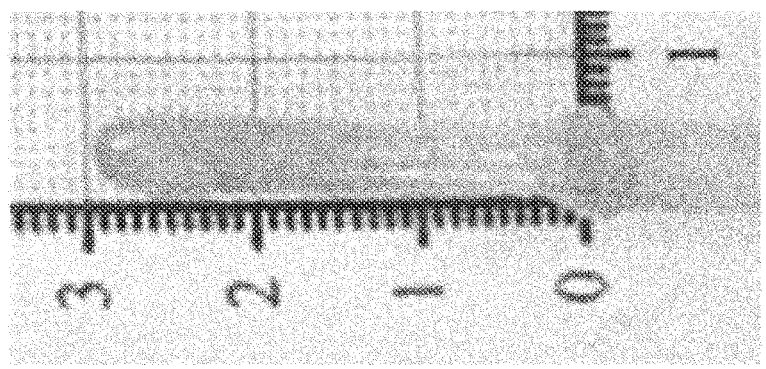
FIG. 1 is an exterior photograph of a $Li_{6.4}Ga_{0.20}La_3Zr_2O_{12}$ single crystal grown in accordance with the FZ method, obtained in an example.

As a result of diligent research on a method for high-temperature melting and cooling of a mixed starting material containing excess lithium and gallium on the basis of the composition ratio of a target solid electrolyte material, the inventors found that a single-crystal of $Li_{7-3x}Ga_xLa_3Zr_2O_{12}$ (0.08≤x<0.5) belonging to the cubic system and having a garnet-type structure can be produced, and confirmed that such a single crystal can be mechanically sliced into fine sections, and perfected the present invention on the basis of these findings. In a case where a single crystal belonging to the cubic system and having a garnet-type structure is grown in accordance with the FZ method, a sample rod is ordinarily rotated at 20 rpm or less and is lowered at a descent speed of about 2 mm/h. Under these conditions, however, voids form in $Li_{7-3x}Ga_xLa_3Zr_2O_{12}$ (0.08≤x<0.5), and thus a high-density crystal cannot be produced.

In order to produce a void-free crystal, a molten portion is cooled at a high speed through lowering of the molten portion at a moving speed of 8 mm/h or higher while a rod-like starting material is caused to rotate at a rotational speed of 30 rpm or higher. Alternatively, a seed crystal is lifted and cooled at a moving speed of 8 mm/h or higher with respect to the molten portion of the starting material. The obtained rod of a high-density $Li_{7-3x}Ga_xLa_3Zr_2O_{12}$ (0.08≤x<0.5) crystal can be cut to an arbitrary thickness using a diamond cutter or the like. Also, the high-density $Li_{7-3x}Ga_xLa_3Zr_2O_{12}$ (0.08≤x<0.5) crystal of the present invention can be produced through melting of a mixed starting material having a greater content of lithium and of gallium than the stoichiometric ratios of the respective metals in the chemical composition $Li_{7-3x}Ga_xLa_3Zr_2O_{12}$ (0.08≤x<0.5), in anticipation of volatilization of lithium and gallium at high temperature.

The solid electrolyte material of the present invention has a chemical composition represented by $Li_{7-3x}Ga_xLa_3Zr_2O_{12}$ (0.08≤x<0.5), a relative density of 99% or higher, belongs to the cubic system, and has a garnet-type structure. The relative density is calculated by measuring the outer shape of a produced thin section, calculating the apparent volume thereof, and dividing the apparent density calculated from the measured mass by the true density obtained on the basis of the results of single-crystal X-ray structural analysis. The solid electrolyte material of the present invention has high density, and accordingly can be easily cut to an arbitrary thickness using a diamond cutter or the like. Also, the solid electrolyte material of the present invention has high ionic conductivity. Specifically, a solid electrolyte material can be obtained that has a lithium ion conductivity of $2.0 \times 10^{-3}$ S/cm or higher.

The solid electrolyte material of the present invention can be produced by forming a molten portion through melting of at least part of a starting material the chemical composition whereof is represented by $Li_{(7-3)y}Ga_{xz}La_3Zr_2O_{12}$ (0.08≤x<0.5, 1.1≤y≤1.4, 1.6≤z≤3.3), and by causing the molten portion or a seed crystal to move at a moving speed of 8 mm/h or higher. Specifically, a high-density $Li_{7-3x}Ga_xLa_3Zr_2O_{12}$ (0.08≤x<0.5) crystal of the present invention is grown in accordance with the FZ method, the Czochralski (CZ) method, the Bridgeman method, a pedestal method or the like. An appropriate production method may be selected from among the foregoing for instance in accordance with the size and shape of the $Li_{7-3x}Ga_xLa_3Zr_2O_{12}$ (0.08≤x<0.5) crystal that is to be produced. Herein a $Li_{7-3x}Ga_xLa_3Zr_2O_{12}$ (0.08≤x<0.5) crystal having a relative density of 100%, i.e. an original $Li_{7-3x}Ga_xLa_3Zr_2O_{12}$ (0.08≤x<0.5) single crystal, can be produced in accordance with the FZ method or the CZ method. A crystal of $Li_{7-3x}Ga_xLa_3Zr_2O_{12}$ (0.08≤x<0.5) having a relative density of 100% is particularly superior in terms of lithium ion conductivity.

To produce the solid electrolyte material of the present invention in accordance with the FZ method, a rod-like starting material is melted while being caused to rotate at a rotational speed of 30 rpm or higher in a plane perpendicular to the longitudinal direction, whereupon a crystal is grown by moving the molten portion in the longitudinal direction. Decomposition of the starting material accompanying volatilization of lithium and gallium is avoided herein by increasing the moving speed of the molten portion to 8 mm/h or higher. To produce the solid electrolyte of the present invention in accordance with the CZ method, the starting material is melted in a crucible, and a crystal is grown by moving the molten portion in the longitudinal direction while a seed crystal is caused to rotate in a plane perpendicular to the longitudinal direction. Decomposition of the starting material due to volatilization of lithium and gallium is avoided herein by increasing the moving speed of the seed crystal to 8 mm/h or higher. The moving speed of the molten portion or of the seed crystal is preferably from 8 mm/h to 19 mm/h. In the case of growth in accordance with the FZ method, volatilization of lithium at the molten portion is bound to give rise to bubbles, but these can be removed herein by raising the rotational speed of the rod-like starting material to 30 rpm or higher. The rotational speed of the starting material is preferably from 30 rpm to 60 rpm. Melting of the starting material and movement of the molten portion are preferably carried out in a dry air atmosphere.

A crystal of $Li_{7-3x}Ga_xLa_3Zr_2O_{12}$ (0.08≤x<0.5) having a relative density of 99% or higher can be produced in this way. A method for producing a solid electrolyte material of the present invention will be explained next on the basis of an example of growing a $Li_{7-3x}Ga_xLa_3Zr_2O_{12}$ (0.08≤x<0.5) crystal having a relative density of 99% or higher, belonging to the cubic system, and having a garnet-type structure. A rod-like starting material is produced first in the manner below. Firstly, a lithium compound, a gallium compound, a lanthanum compound and a zirconium compound are weighed so that a molar ratio Li:Ga:La:Zr is (7-3x)y:xz:3:2 (0.08≤x<0.5, 1.1≤y≤1.4, 1.6≤z≤3.3), in anticipation of volatilization of lithium at high temperature.

The lithium compound is not particularly limited so long as it contains lithium, and examples thereof include oxides such as $Li_2O$ and carbonates such as $Li_2CO_3$. The gallium compound is not particularly limited so long as it contains gallium, and examples thereof include oxides such as $Ga_2O_3$ and nitrates such as $Ga(NO_3)_3$. The lanthanum compound is not particularly limited so long as it contains lanthanum, and examples thereof include oxides such as $La_2O_3$ and hydroxides such as $La(OH)_3$. The zirconium compound is not particularly limited so long as it contains zirconium, and examples thereof include oxides such as $ZrO_2$ and chlorides such as $ZrCl_4$.

A compound made up of two or more types selected from among lithium, gallium, lanthanum and zirconium may be used and weighed so that the molar ratio Li:Ga:La:Zr is (7-3x)y:xz:3:2 (0.08≤x<0.5, 1.1≤y≤1.4, 1.6≤z≤3.3). Examples of such compounds made up of two or more types include lanthanum zirconium oxides such as $La_2Zr_2O_7$, gallium lanthanum oxides such as $GaLaO_6$, lithium gallium oxides such as $Li_5GaO_4$, and lithium zirconium oxides such as $Li_2ZrO_3$.

The weighed compounds are mixed next. The mixing method is not particularly limited so long as these compounds can be mixed uniformly, and for instance the method may involve wet or dry mixing using a mixing apparatus such as a mixer. The obtained mixture is filled into a lidded crucible, and thereafter the mixture is pre-fired at 600° C. to 900° C., preferably at 850° C., to thereby obtain a starting material powder. More preferably, the pre-fired starting material is repeatedly pulverized, mixed and fired once again.

In order to facilitate molding, the obtained starting material powder is then pulverized to reduce the particle size of the powder. The pulverization method is not particularly limited so long as the powder can be finely broken up, and for instance pulverization may be of wet or of dry type using a pulverizer such as a planetary ball mill, a pot mill or a bead mill. The obtained pulverized product is filled into a rubber tube, and is thereafter isostatically pressed, to form the pulverized product into a rod shape. The obtained rod-like molded body is fired at from about 700° C. to 1300° C., preferably from 800° C. to 1150° C., for about 4 hours, to yield a rod-like starting material. The chemical composition of the starting material at this point in time is $Li_{(7-3)y}Ga_{xz}La_3Zr_2O_{12}$ (0.08≤x<0.5, 1.1≤y≤1.4, 1.6≤z≤3.3). A rod-like starting material can be thus produced in this manner.

This rod-like starting material is then melted in an infrared condensing heating furnace, and is thereafter quenched, to produce as a result $Li_{7-3x}Ga_xLa_3Zr_2O_{12}$ (0.08≤x<0.5) that has a relative density of 99% or higher, belongs to the cubic system, and has a garnet-type structure. Herein a $Li_{7-3x}Ga_xLa_3Zr_2O_{12}$ (0.08≤x<0.5) crystal having a length of 2 cm or more is obtained in accordance with this production method. Accordingly, thin sections of identical quality can be easily produced by cutting. The procedure below is carried out when producing a high-density $Li_{7-3x}Ga_xLa_3Zr_2O_{12}$ (0.08≤x<0.5) crystal in accordance with the CZ method. Firstly, a starting material is placed in a crucible and is melted through heating. Next, a seed crystal is dipped in the starting material melt and is pulled up while being rotated. The rotational speed of the seed crystal is preferably from 3 rpm to 30 rpm. It is deemed that volatilization of lithium and gallium is curtailed, and a high-density $Li_{7-3x}Ga_xLa_3Zr_2O_{12}$ (0.08≤x<0.5) crystal is obtained, by increasing the moving speed of the seed crystal to 8 mm/h or higher. In addition, $Li_{7-3x}Ga_xLa_3Zr_2O_{12}$ (0.08≤x<0.5) grown in accordance with a melting method tends to exhibit a longer lattice constant than that of a sample synthesized in accordance with a conventional solid phase method.

The high-density $Li_{7-3x}Ga_xLa_3Zr_2O_{12}$ (0.08≤x<0.5) crystal of the present invention has excellent lithium ion conductivity, and hence can be used as a solid electrolyte in all-solid-state lithium ion secondary batteries. That is, an all-solid-state lithium ion secondary battery of the present invention has a positive electrode, a negative electrode, and a solid electrolyte, wherein the solid electrolyte is made up of the solid electrolyte material of the present invention. The present invention will be described in further detail hereafter with reference to examples, but the invention is not limited to these examples.

Example 1

(Mixing of $Li_{6.4}Ga_{0.2}La_3Zr_2O_{12}$ Starting Materials)

Firstly, 15.318 g of lithium carbonate $Li_2CO_3$ (by RARE METALLIC Co., Ltd., purity 99.99%), 2.061 g of gallium oxide $Ga_2O_3$ (by RARE METALLIC Co., Ltd., purity 99.99%), 26.873 g of lanthanum oxide $La_2O_3$ (by RARE METALLIC Co., Ltd., purity 99.99%) and 13.551 g of zirconium oxide $ZrO_2$ (by RARE METALLIC Co., Ltd., purity 99.99%) were placed in an agate mortar, and were mixed uniformly in accordance with a wet method using ethanol. The lanthanum oxide used herein had been pre-fired beforehand at 900° C. In the metal molar ratio Li:Ga:La:Zr of this mixture the amount of lithium is 1.3 times the stoichiometric ratio, and the amount of gallium twice the stoichiometric ratio, of the target composition of $Li_{6.4}Ga_{0.2}La_3Zr_2O_{12}$ as the target product. That is, the chemical composition corresponds qualitatively to $Li_{8.32}Ga_{0.4}La_3Zr_2O_{12}$.

Next, a lidded alumina crucible (by Nikkato Corporation, C3 model) was filled with 57.1803 g of this mixture. The crucible was placed in a box-type electric furnace (by Yamato Scientific Co., Ltd., FP100 model) and was pre-fired at 850° C. for 6 hours, to yield a powder. The obtained powder was ground. Specifically, 57 g of the powder, 300 g of zirconia balls having a diameter of 5 mm, and 100 g of isopropanol were filled into a zirconia-made pulverizing vessel having a capacity of 250 mL, and pulverization was carried through rotation for a total of 300 minutes at a revolution speed of 200 rpm using a planetary ball mill (by Fritsch GmbH, model P-6). The ground powder was dried at 100° C. for 24 hours and was classified using a 250 μm mesh sieve.

(Production of Rod-Like Starting Material)

A rod-like starting material was produced in accordance with the following procedure, using the powder having passed through the sieve in the above step. Firstly, a rubber-made mold was filled with 15.127 g of this powder, followed by degassing. The mold, in a sealed state, was then submerged in water and was held at 40 MPa for 5 minutes. After reducing the water pressure, the resulting molded body was retrieved from the mold. The molded body had a cylindrical shape with a diameter of 1.1 cm and a height of 7.5 cm. This cylindrical molded body was fired at 1150° C. for 4 hours using a box-type electric furnace (by DENKEN-HIGHDENTAL Co., Ltd., model number KDF009). The retrieved molded body had a cylindrical shape with a diameter of 0.75 cm and a height of 5.2 cm.

(Growth of $Li_{6.4}Ga_{0.2}La_3Zr_2O_{12}$ Crystal)

Firstly, the rod-like starting material obtained in the above step was set in a four-ellipsoid-type infrared condensing heating furnace (FZ furnace) (FZ-T-10000H model, by Crystal Systems Inc.) equipped with a 1 kW halogen lamp, the atmosphere in the furnace being a dry air atmosphere. Next, the rod-like starting material was heated at an output of 23.3% while being caused to rotate at 40 rpm in a plane perpendicular to the longitudinal direction. After a while, part of the polycrystalline sample melted to form a melted portion. A setting stand of the rod-like starting material was lowered at a moving speed of 10 mm/h, to grow a high-density $Li_{6.4}Ga_{0.2}La_3Zr_2O_{12}$ crystal (hereafter also referred to as "Sample 1"). The chemical composition of Sample 1 was analyzed by ICP-AES and by single-crystal X-ray crystallographic analysis. The result of ICP-AES yielded a chemical composition of Li:Ga:La:Zr=6.4:0.2:3.0:2.0. FIG. 1 depicts the appearance of Sample 1. FIG. 1 reveals that a high-density $Li_{6.4}Ga_{0.2}La_3Zr_2O_{12}$ crystal having a length of 3 cm could be produced.

(Evaluation of High-Density $Li_{6.4}Ga_{0.2}La_3Zr_2O_{12}$ Crystal)

Figure 2:
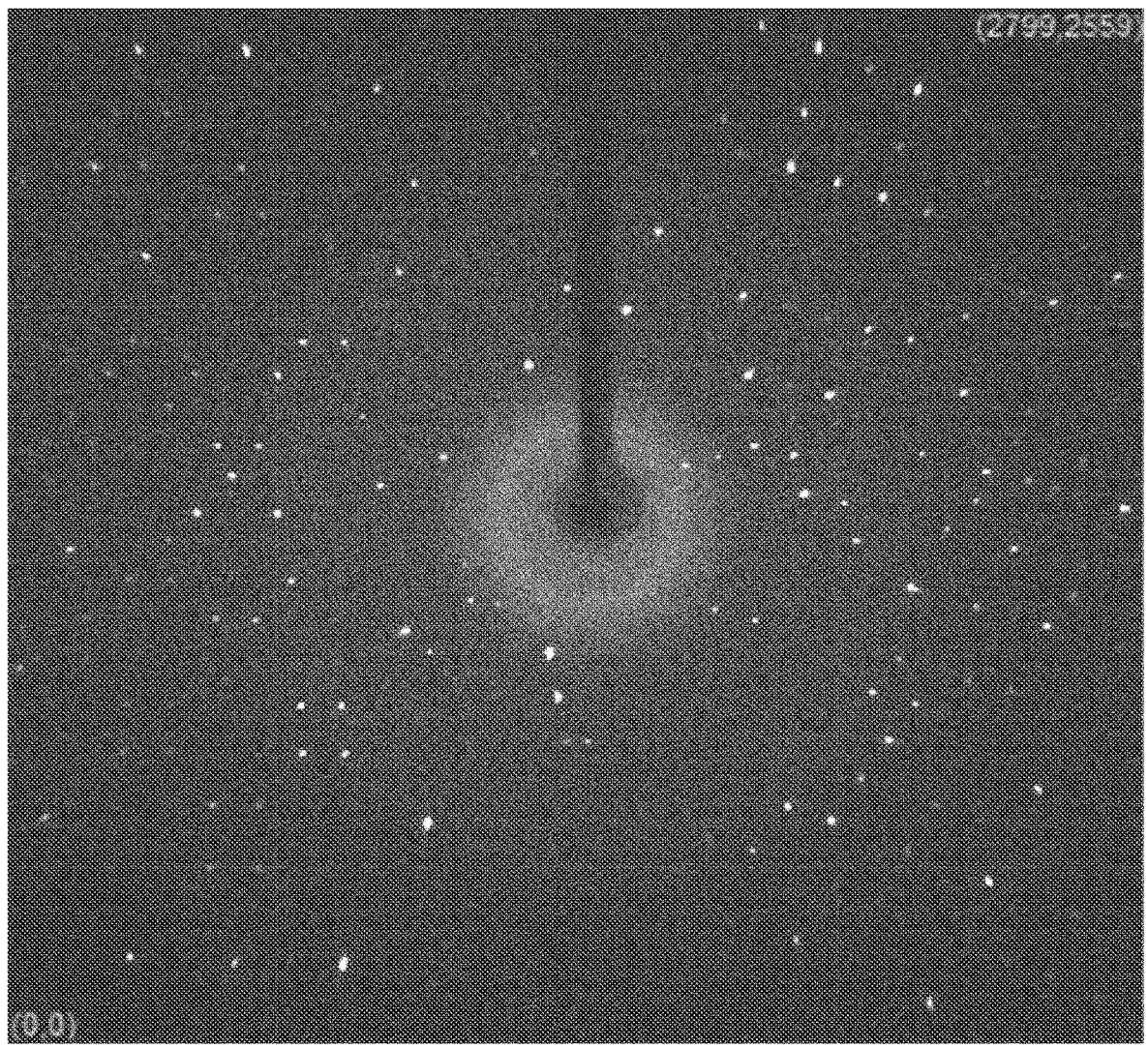
FIG. 2 is a single-crystal X-ray diffraction pattern of a $Li_{6.4}Ga_{0.20}La_3Zr_2O_{12}$ single crystal obtained in an example.

The structure of Sample 1 was investigated using a single-crystal X-ray diffractometer (R-AXIS RAPID-II, by Rigaku Corporation) having a two-dimensional IP detector. FIG. 2 depicts the X-ray diffraction pattern of Sample 1. As FIG. 2 illustrates, clear diffraction points could be measured. Diffraction intensity data of Sample 1 was collected, and the crystal structure was elucidated using the crystallographic analysis program Jana2006; it was thereupon found that Sample 1 belonged to a cubic crystal. Sample 1 was cut with a diamond cutter to prepare four thin sections having a thickness of 0.1 cm, and the relative densities thereof were calculated in accordance with the above method. The results of relative density were 99.5%, 99.8%, 99.9% and 100%, respectively.

Figure 3:
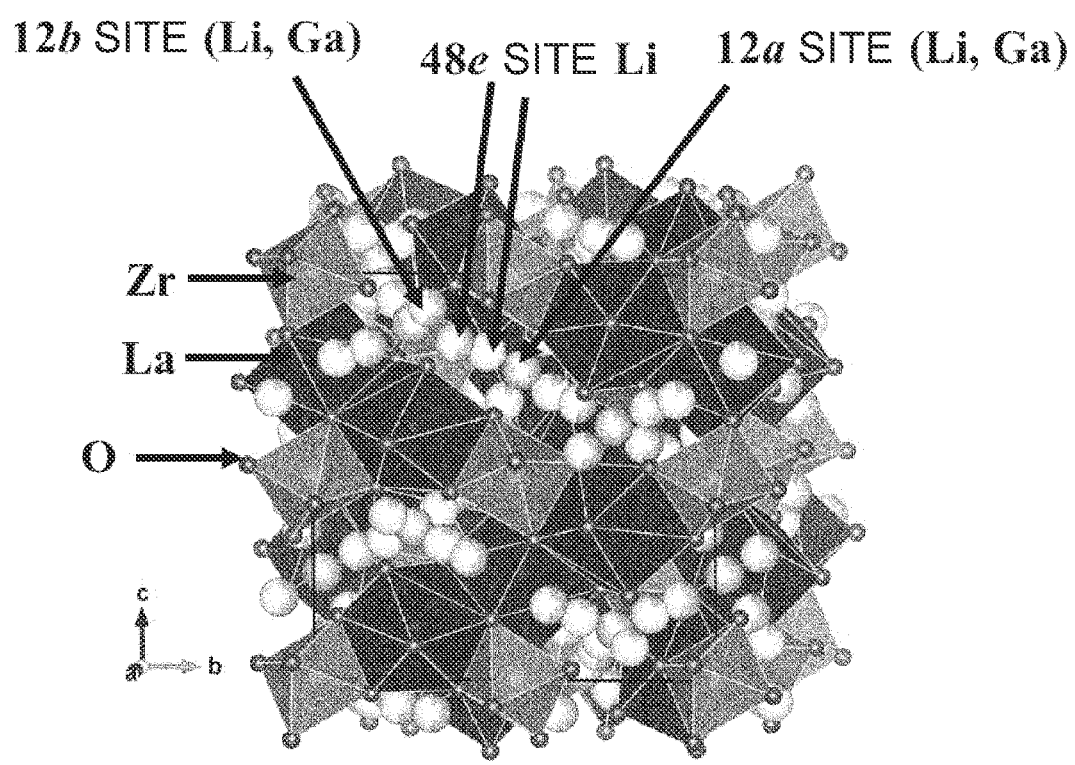
FIG. 3 is a schematic diagram illustrating a garnet-type structure of a $Li_{6.4}Ga_{0.20}La_3Zr_2O_{12}$ single crystal obtained in an example.

FIG. 3 illustrates schematically the structure of Sample 1. The reported cubic garnet-type structure $Li_{7-3x}Ga_xLa_3Zr_2O_{12}$ belongs to the space group I-43d; herein Non-Patent Document 1 indicates that the 12a site, the 12b site and the 48e site in the crystal structure are lithium ion sites, and that the 12a site and the 12b site are gallium ion sites. Non-Patent Document 2 indicates that the 12a site, the 12b site in the crystal structure, and two types of 48e site are lithium ion sites, and the 12a site, the 12b site and the 24d site, which is a lanthanum site, are gallium ion sites. By contrast, in Sample 1 grown in accordance with a melting method the 12a site (coordinates x=0.75, y=0.625, z=0), the 12b site (coordinates x=0.75, y=0.125, z=0), the two types of 48e site (coordinates x=0.6597, y=0.5490, z=0.1707, and coordinates x=0.6918, y=0.5739, z=0.0990) in the crystal structure were lithium ion sites, and the 12a site and the 12b site were gallium ion sites. That is, Sample 1 was a new substance having a crystal structure different from those of Non-Patent Document 1 and Non-Patent Document 2. The R factor denoting the reliability of this crystallographic analysis was 2.26%, and hence of the result of the crystallographic analysis is ostensibly valid.

Figure 4:
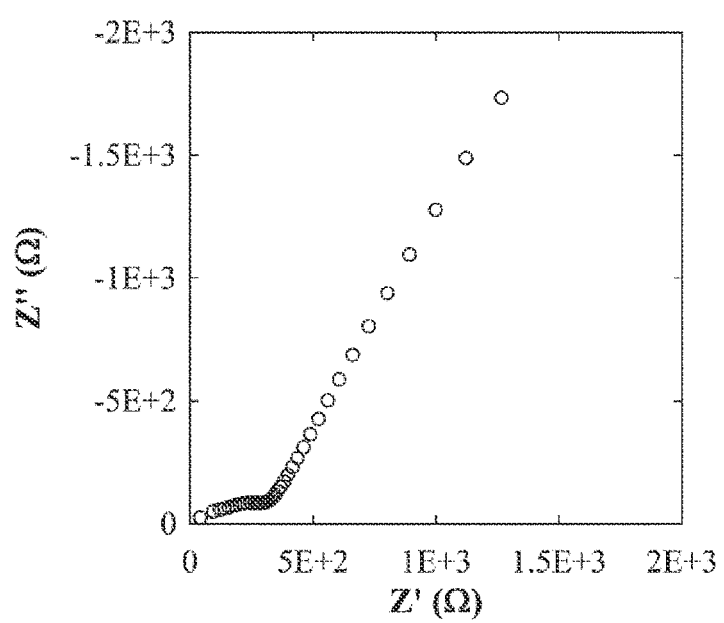
FIG. 4 is a Nyquist plot, in accordance with an AC impedance method, of a $Li_{6.4}Ga_{0.20}La_3Zr_2O_{12}$ single crystal obtained in an example.

This arrangement of lithium ions exhibits the shortest distance between lithium ions, with a moderate number of missing lithium ion sites in the gallium-substituted cubic garnet-type structure. It is therefore deemed that the lithium ion conductivity of Sample 1 is higher than that of other cubic garnet-type structure compounds. Sample 1 was cut to produce a thin section having a diameter of about 0.50 cm and a thickness of about 0.10 cm. Electrodes were formed on the front and back of the thin section by sputtering of gold having a circular bottom surface with a 0.40 cm side, and having a thickness of 40 nm. The lithium ion conductivity of this sample was measured in accordance with an AC impedance method (measuring device: Solarton, 1260) at 25° C. in a nitrogen atmosphere, to yield the Nyquist plot illustrated in FIG. 4; the value calculated from the total resistance value was $2.4 \times 10^{-3}$ S/cm. Lithium ion conductivity was then calculated by modifying the measurement temperature in the AC impedance measurement, and the results were used to construct an Arrhenius plot on the basis of which activation energy was calculated, yielding a value of 0.23 eV.

Figure 5:
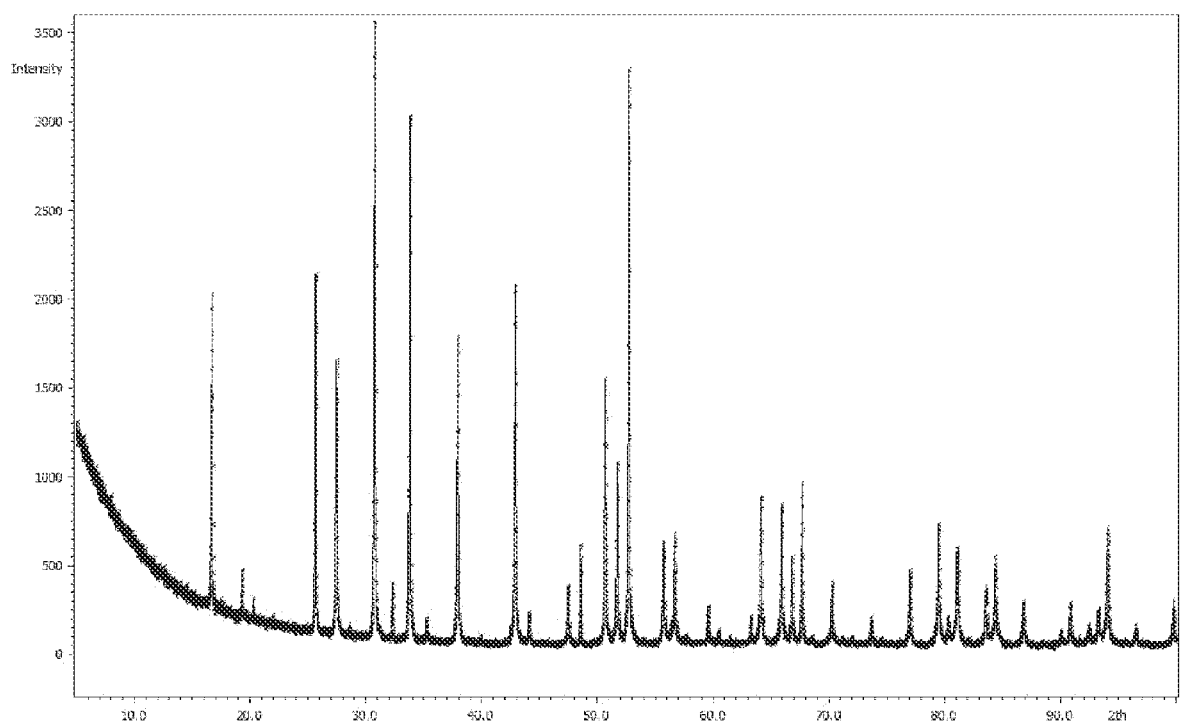
FIG. 5 is a powder X-ray diffraction pattern of a $Li_{6.4}Ga_{0.20}La_3Zr_2O_{12}$ single crystal obtained in an example.

The lattice constant a was worked out in accordance with a least squares method using the reflection observed in the single-crystal X-ray diffraction measurement of Sample 1; the result was a=1.29714 nm±0.00005 nm. This lattice constant indicated that Sample 1 was a lithium complex oxide having a garnet-type structure. Sample 1 was pulverized and subjected to a powder X-ray diffraction measurement; the results are illustrated in FIG. 5. The powder X-ray diffraction pattern of Sample 1 was similar to the single-phase diffraction pattern of a cubic garnet-type structure. The lattice constant a calculated from the results of powder X-ray structural analysis was a=1.29825 nm±0.00001 nm. Combining the results of the single-crystal X-ray diffraction measurement and the powder X-ray structural analysis, the lattice constant of Sample 1 is thus 1.29714≤a≤1.29825 nm.

Example 2

(Mixing of $Li_{6.76}Ga_{0.08}La_3Zr_2O_{12}$ Starting Materials)

Firstly, 28.349 g of lithium carbonate $Li_2CO_3$ (by RARE METALLIC Co., Ltd., purity 99.99%), 2.3979 g of gallium oxide $Ga_2O_3$ (by RARE METALLIC Co., Ltd., purity 99.99%), 50.000 g of lanthanum oxide $La_2O_3$ (by RARE METALLIC Co., Ltd., purity 99.99%) and 25.213 g of zirconium oxide $ZrO_2$ (by RARE METALLIC Co., Ltd., purity 99.99%) were placed in an agate mortar, and were mixed uniformly in accordance with a wet method using ethanol. The lanthanum oxide used herein had been pre-fired beforehand at 900° C. In the metal molar ratio Li:Ga:La:Zr of this mixture the amount of lithium is 1.2 times the stoichiometric ratio, and the amount of gallium 3.2 times the stoichiometric ratio, of the target composition of $Li_{6.76}Ga_{0.08}La_3Zr_2O_{12}$ as the target product. That is, the chemical composition corresponds qualitatively to $Li_{8.11}Ga_{0.25}La_3Zr_2O_{12}$.

Next, a lidded alumina crucible (by Nikkato Corporation, C3 model) was filled with 57.273 g of this mixture. The crucible was placed in a box-type electric furnace (by Yamato Scientific Co., Ltd., FP100 model) and was pre-fired at 850° C. for 6 hours, to yield a powder. The obtained powder was ground. Specifically, 57 g of the powder, 300 g of zirconia balls having a diameter of 5 mm, and 100 g of isopropanol were filled into a zirconia-made pulverizing vessel having a capacity of 250 mL, and pulverization was carried through rotation for a total of 300 minutes at a revolution speed of 200 rpm using a planetary ball mill (by Fritsch GmbH, model P-6). The ground powder was dried at 100° C. for 24 hours and was classified using a 250 μm mesh sieve.

(Production of Rod-Like Starting Material)

A rod-like starting material was produced in accordance with the following procedure, using the powder having passed through the sieve in the above step. Firstly, a rubber-made mold was filled with 15.098 g of this powder, followed by degassing. The mold, in a sealed state, was then submerged in water and was held at 40 MPa for 5 minutes. After reducing the water pressure, the resulting molded body was retrieved from the mold. The molded body had a cylindrical shape with a diameter of 1.1 cm and a height of 7.5 cm. This cylindrical molded body was fired at 1150° C. for 4 hours using a box-type electric furnace (by DENKEN-HIGHDENTAL Co., Ltd., model number KDF009). The retrieved molded body had a cylindrical shape with a diameter of 0.78 cm and a height of 5.8 cm.

(Growth of $Li_{6.76}Ga_{0.08}La_3Zr_2O_{12}$ Crystal)

Figure 6:
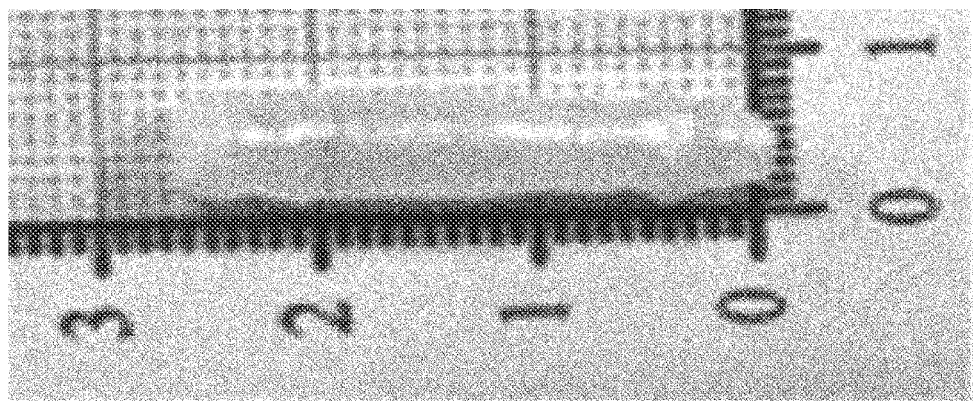
FIG. 6 is an exterior photograph of a $Li_{6.76}Ga_{0.08}La_3Zr_2O_{12}$ single crystal grown in accordance with the FZ method, obtained in an example.

Firstly, the rod-like starting material obtained in the above step was set in a four-ellipsoid-type infrared condensing heating furnace (FZ furnace) (FZ-T-10000H model, by Crystal Systems Inc.) equipped with a 1 kW halogen lamp, the atmosphere in the furnace being a dry air atmosphere. Next, the rod-like starting material was heated at an output of 22.9% while being caused to rotate at 40 rpm in a plane perpendicular to the longitudinal direction. After a while, part of the polycrystalline sample melted to form a melted portion. A setting stand of the rod-like starting material was lowered at a moving speed of 10 mm/h, to grow a high-density $Li_{6.76}Ga_{0.08}La_3Zr_2O_{12}$ crystal (hereafter also referred to as "Sample 2"). The chemical composition of Sample 2 was analyzed by ICP-AES and by single-crystal X-ray crystallographic analysis. FIG. 6 depicts the appearance of Sample 2, for which the result of ICP-AES yielded a chemical composition of Li:Ga:La:Zr=6.8:0.08:3.0:2.0. As illustrated in FIG. 6, a high-density $Li_{6.76}Ga_{0.08}La_3Zr_2O_{12}$ crystal having a length of 3 cm could be produced.

(Evaluation of High-Density $Li_{6.76}Ga_{0.08}La_3Zr_2O_{12}$ Crystal)

The structure of Sample 1 was investigated using a single-crystal X-ray diffractometer (R-AXIS RAPID-II, AFC-7S, by Rigaku Corporation) having a two-dimensional IP detector. Diffraction intensity data of Sample 2 was collected, and the crystal structure was elucidated using the crystallographic analysis program Jana2006; it was thereupon found that Sample 2 belonged to a crystal structure similar to that of Sample 1.

The lattice constant a was worked out in accordance with a least squares method using the reflection observed in the single-crystal X-ray diffraction measurement of Sample 2; the result was a=1.30433 nm±0.00014 nm. This lattice constant indicated that Sample 2 was a lithium complex oxide having a garnet-type structure. Sample 2 was pulverized and subjected to a powder X-ray diffraction measurement; the lattice constant a calculated from the results of powder X-ray structural analysis was a=1.29985 nm±0.00001 nm. Combining the results of the single-crystal X-ray diffraction measurement and the powder X-ray structural analysis, the lattice constant of Sample 1 is thus 1.29985≤a≤1.30433 nm.

Example 3

(Mixing of $Li_{6.25}Ga_{0.25}La_3Zr_2O_{12}$ Starting Materials)

Firstly, 18.416 g of lithium carbonate $Li_2CO_3$ (by RARE METALLIC Co., Ltd., purity 99.99%), 2.301 g of gallium oxide $Ga_2O_3$ (by RARE METALLIC Co., Ltd., purity 99.99%), 30.000 g of lanthanum oxide $La_2O_3$ (by RARE METALLIC Co., Ltd., purity 99.99%) and 15.128 g of zirconium oxide $ZrO_2$ (by RARE METALLIC Co., Ltd., purity 99.99%) were placed in an agate mortar, and were mixed uniformly in accordance with a wet method using ethanol. The lanthanum oxide used herein had been pre-fired beforehand at 900° C. In the metal molar ratio Li:Ga:La:Zr of this mixture the amount of lithium is 1.3 times the stoichiometric ratio, and the amount of gallium 1.6 times the stoichiometric ratio, of the target composition of $Li_{6.25}Ga_{0.25}La_3Zr_2O_{12}$ as the target product. That is, the chemical composition corresponds qualitatively to $Li_{8.13}Ga_{0.40}La_3Zr_2O_{12}$.

Next, a lidded alumina crucible (by Nikkato Corporation, C3 model) was filled with 57.273 g of this mixture. The crucible was placed in a box-type electric furnace (by Yamato Scientific Co., Ltd., FP100 model) and was pre-fired at 850° C. for 6 hours, to yield a powder. The obtained powder was ground. Specifically, 57 g of the powder, 300 g of zirconia balls having a diameter of 5 mm, and 100 g of isopropanol were filled into a zirconia-made pulverizing vessel having a capacity of 250 mL, and pulverization was carried through rotation for a total of 300 minutes at a revolution speed of 200 rpm using a planetary ball mill (by Fritsch GmbH, model P-6). The ground powder was dried at 100° C. for 24 hours and was classified using a 250 μm mesh sieve.

(Production of Rod-Like Starting Material)

A rod-like starting material was produced in accordance with the following procedure, using the powder having passed through the sieve in the above step. Firstly, a rubber-made mold was filled with 15.128 g of this powder, followed by degassing. The mold, in a sealed state, was then submerged in water and was held at 40 MPa for 5 minutes. After reducing the water pressure, the resulting molded body was retrieved from the mold. The molded body had a cylindrical shape with a diameter of 1.1 cm and a height of 7.5 cm. This cylindrical molded body was fired at 1150° C. for 4 hours using a box-type electric furnace (by DENKEN-HIGHDENTAL Co., Ltd., model number KDF009). The retrieved molded body had a cylindrical shape with a diameter of 0.79 cm and a height of 6.0 cm.

(Growth of $Li_{6.25}Ga_{0.25}La_3Zr_2O_{12}$ Crystal)

Figure 7:
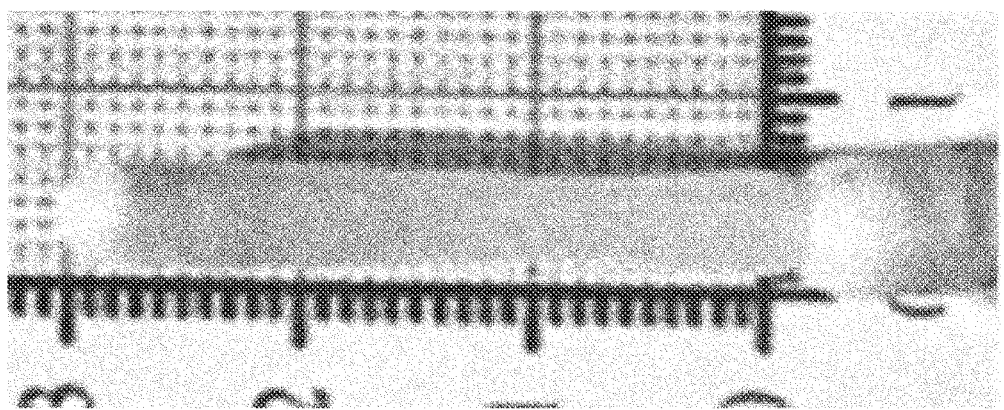
FIG. 7 is an exterior photograph of a $Li_{6.25}Ga_{0.25}La_3Zr_2O_{12}$ single crystal grown in accordance with the FZ method, obtained in an example.

Firstly, the rod-like starting material obtained in the above step was set in a four-ellipsoid-type infrared condensing heating furnace (FZ furnace) (FZ-T-10000H model, by Crystal Systems Inc.) equipped with a 1 kW halogen lamp, the atmosphere in the furnace being a dry air atmosphere. Next, the rod-like starting material was heated at an output of 23.1% while being caused to rotate at 40 rpm in a plane perpendicular to the longitudinal direction. After a while, part of the polycrystalline sample melted to form a melted portion. A setting stand of the rod-like starting material was lowered at a moving speed of 10 mm/h, to grow a high-density $Li_{6.25}Ga_{0.25}La_3Zr_2O_{12}$ crystal (hereafter also referred to as "Sample 3"). The chemical composition of Sample 3 was analyzed by ICP-AES and by single-crystal X-ray crystallographic analysis. FIG. 7 depicts the appearance of Sample 3, for which the result of ICP-AES yielded a chemical composition of Li:Ga:La:Zr=6.25:0.25:3.0:2.0. As illustrated in FIG. 7, a high-density $Li_{6.25}Ga_{0.25}La_3Zr_2O_{12}$ crystal having a length of 3 cm could be produced.

(Evaluation of High-Density $Li_{6.25}Ga_{0.25}La_3Zr_2O_{12}$ Crystal)

The structure of Sample 3 was investigated using a single-crystal X-ray diffractometer (R-AXIS RAPID-II, by Rigaku Corporation) having a two-dimensional IP detector. Diffraction intensity data of Sample 3 was collected, and the crystal structure was elucidated using the crystallographic analysis program Jana2006; it was thereupon found that Sample 3 belonged to a crystal structure similar to that of Sample 1.

The lattice constant a was worked out in accordance with a least squares method using the reflection observed in the single-crystal X-ray diffraction measurement of Sample 3; the result was a=1.30364 nm±0.00025 nm. This lattice constant indicated that Sample 3 was a lithium complex oxide having a garnet-type structure. Sample 3 was pulverized and subjected to a powder X-ray diffraction measurement; the lattice constant a calculated from the results of powder X-ray structural analysis was a=1.29993 nm±0.00001 nm. Combining the results of the single-crystal X-ray diffraction measurement and the powder X-ray structural analysis, the lattice constant of Sample 3 is thus $1.29993 \leq a \leq 1.30364$ nm.

Example 4

Production of $Li_{6.64}Ga_{0.12}La_3Zr_2O_{12}$ Crystal in Accordance with CZ Method (Mixing of $Li_{6.64}Ga_{0.12}La_3Zr_2O_{12}$ Starting Materials)

Firstly, 15.785 g of lithium carbonate $Li_2CO_3$ (by RARE METALLIC Co., Ltd., purity 99.99%), 2.301 g of gallium oxide $Ga_2O_3$ (by RARE METALLIC Co., Ltd., purity 99.99%), 30.000 g of lanthanum oxide $La_2O_3$ (by RARE METALLIC Co., Ltd., purity 99.99%) and 15.128 g of zirconium oxide $ZrO_2$ (by RARE METALLIC Co., Ltd., purity 99.99%) were placed in an agate mortar, and were mixed uniformly in accordance with a wet method using ethanol. The lanthanum oxide used was pre-fired beforehand at 900° C. In the metal molar ratio Li:Ga:La:Zr of this mixture the amount of lithium is 1.2 times the stoichiometric ratio, and the amount of gallium 3.3 times the stoichiometric ratio, of the target composition of $Li_{6.64}Ga_{0.12}La_3Zr_2O_{12}$ as the target product. That is, the chemical composition corresponds qualitatively to $Li_{7.968}Ga_{0.40}La_3Zr_2O_{12}$.

(2) Growth of $Li_{6.64}Ga_{0.12}La_3Zr_2O_{12}$ Crystal

Firstly, a cylindrical iridium vessel having an inner diameter of 2.6 cm and a depth of 2.8 cm was filled with 28 g of the polycrystalline $Li_{7.968}Ga_{0.40}La_3Zr_2O_{12}$ powder obtained in the above step. Next, this iridium vessel was set in a single crystal pulling furnace (CZ furnace) (TCH-3, by TECHNO SEARCH Corp) having a high-frequency induction heating function. Then an iridium rod having a length of 50 mm was set in a pull-up portion, and a dry nitrogen atmosphere was created in the CZ furnace. High-frequency output was then gradually increased, and the iridium vessel was continuously heated at an output of 58.8%. The $Li_{7.968}Ga_{0.40}La_3Zr_2O_{12}$ powder that filled the iridium vessel melted after a while.

Figure 8:
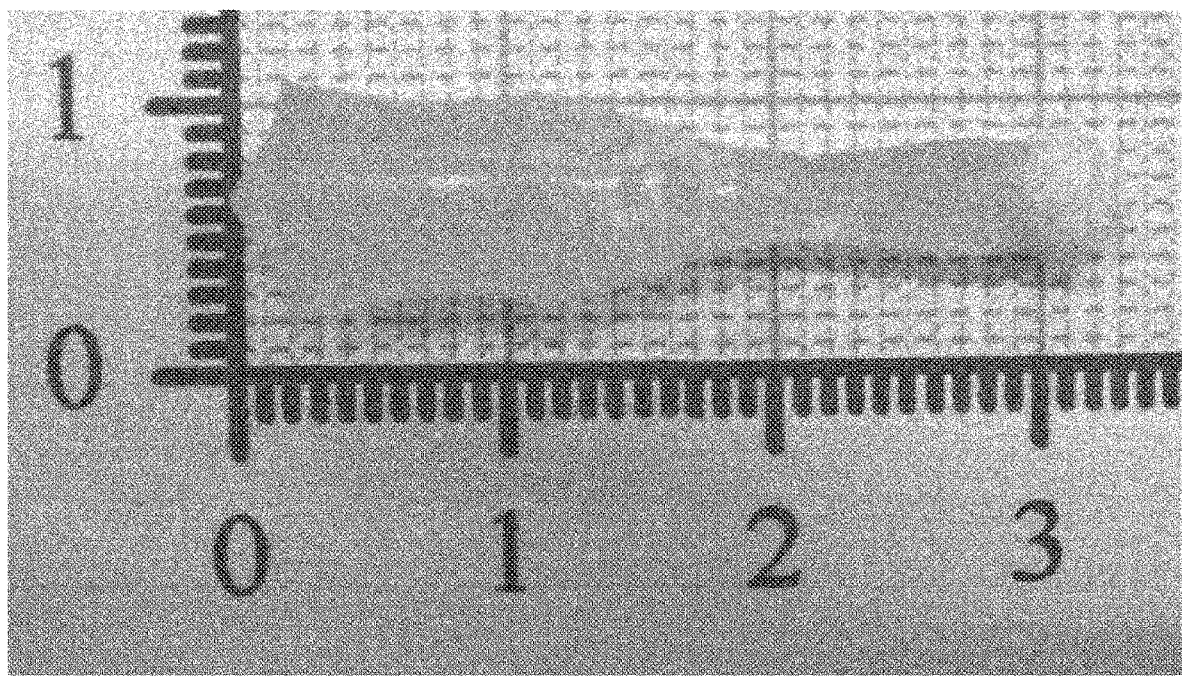
FIG. 8 is an exterior photograph of a $Li_{6.64}Ga_{0.12}La_3Zr_2O_{12}$ single crystal grown in accordance with the CZ method, obtained in an example.

Next, the iridium rod was dipped in the molten portion of $Li_{7.968}Ga_{0.40}La_3Zr_2O_{12}$ while being caused to rotate at 3 rpm in a plane perpendicular to the longitudinal direction, and thereafter the iridium rod was lifted at a moving speed of 10 mm/h, to thereby grow a $Li_{6.64}Ga_{0.12}La_3Zr_2O_{12}$ crystal. FIG. 8 depicts the appearance of the grown $Li_{6.64}Ga_{0.12}La_3Zr_2O_{12}$ crystal (hereafter also referred to as "Sample 4").

(Evaluation of High-Density $Li_{6.64}Ga_{0.12}La_3Zr_2O_{12}$ Crystal)

Figure 9:
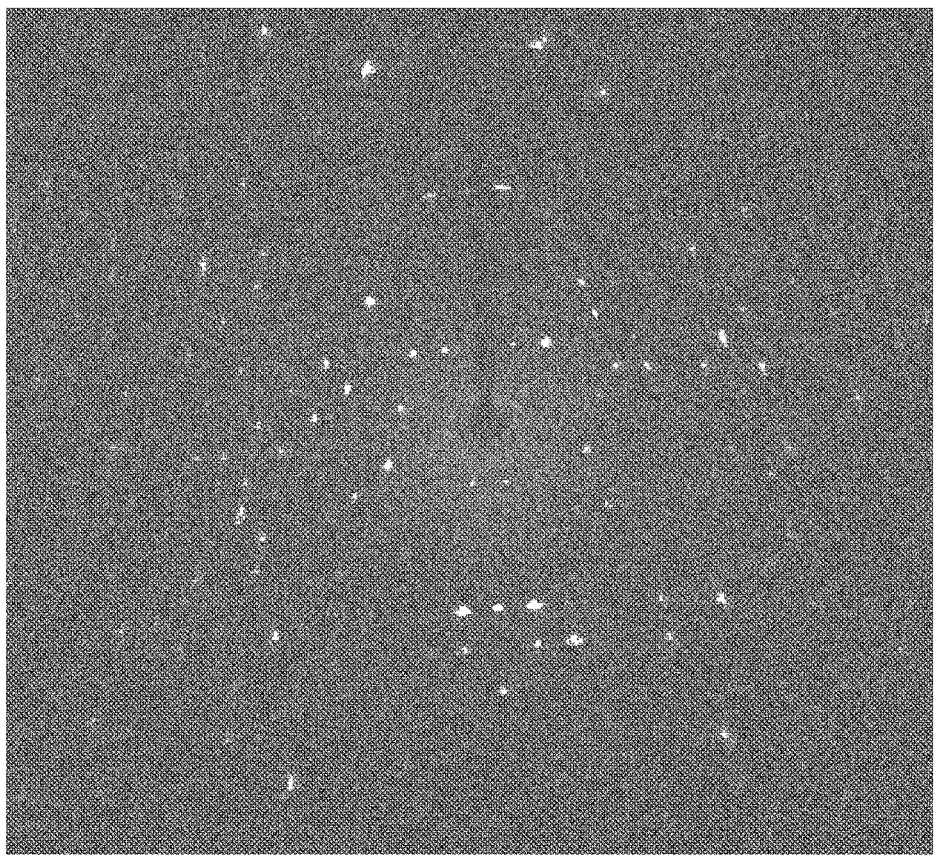
FIG. 9 is a single-crystal X-ray diffraction pattern of a $Li_{6.64}Ga_{0.12}La_3Zr_2O_{12}$ single crystal obtained in an example.

The structure of Sample 4 was investigated using a single-crystal X-ray diffractometer (R-AXIS RAPID-II, by Rigaku Corporation) having a two-dimensional IP detector. FIG. 9 depicts the X-ray diffraction pattern of Sample 4. As FIG. 9 illustrates, clear diffraction points could be measured. Diffraction intensity data of Sample 1 was collected, and the crystal structure was elucidated using the crystallographic analysis program Jana2006; it was thereupon found that Sample 4 belonged to a cubic crystal, ostensibly not different from that of the single crystal grown in accordance with the FZ method. The result of single-crystal X-ray analysis revealed that the chemical composition of Sample 4 was $Li_{6.64}Ga_{0.12}La_3Zr_2O_{12}$.

Figure 10:
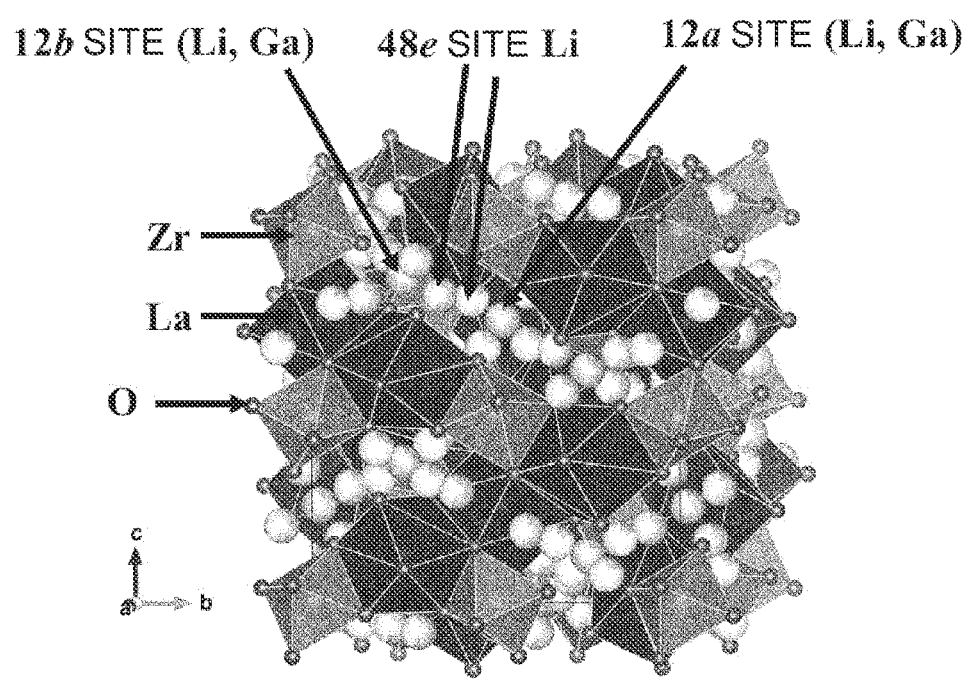
FIG. 10 is a schematic diagram illustrating a garnet-type structure of a $Li_{6.64}Ga_{0.12}La_3Zr_2O_{12}$ single crystal obtained in an example.

FIG. 10 illustrates schematically the structure of Sample 4. It was found that the crystal structure was similar to that of the crystal grown in accordance with the FZ method. The reported cubic garnet-type structure $Li_{7-3x}Ga_xLa_3Zr_2O_{12}$ belongs to the space group I-43d; herein Non-Patent Document 1 indicates that the 12a site, the 12b site and the 48e site in the crystal structure are lithium ion sites, and the 12a site and the 12b site are gallium ion sites. Non-Patent Document 2 indicates that the 12a site, the 12b site and the two types of 48e site in the crystal structure are lithium ion sites, and the 12a site, the 12b site and the 24d site, which is a lanthanum site, are gallium ion sites. By contrast, in Sample 4 grown in accordance with a melting method, lithium ions occupied the 12a site (coordinates x=0.75, y=0.625, z=0), the 12b site (coordinates x=0.75, y=0.125, z=0), and the two types of 48e (coordinates x=0.6678, y=0.5607, z=0.1735, and coordinates x=0.6970, y=0.5738, z=0.0948) in the crystal structure, while the 12a site (coordinates x=0.75, y=0.625, z=0) and the 12b site (coordinates x=0.75, y=0.125, z=0) were gallium ion sites. That is, Sample 4 was a new substance, similar to the single crystal grown in accordance with the FZ method, and having a crystal structure different from those of Non-Patent Document 1 and Non-Patent Document 2. The R factor denoting the reliability of this crystallographic analysis was 3.35%, and hence of the result of the crystallographic analysis is ostensibly valid.

Figure 11:
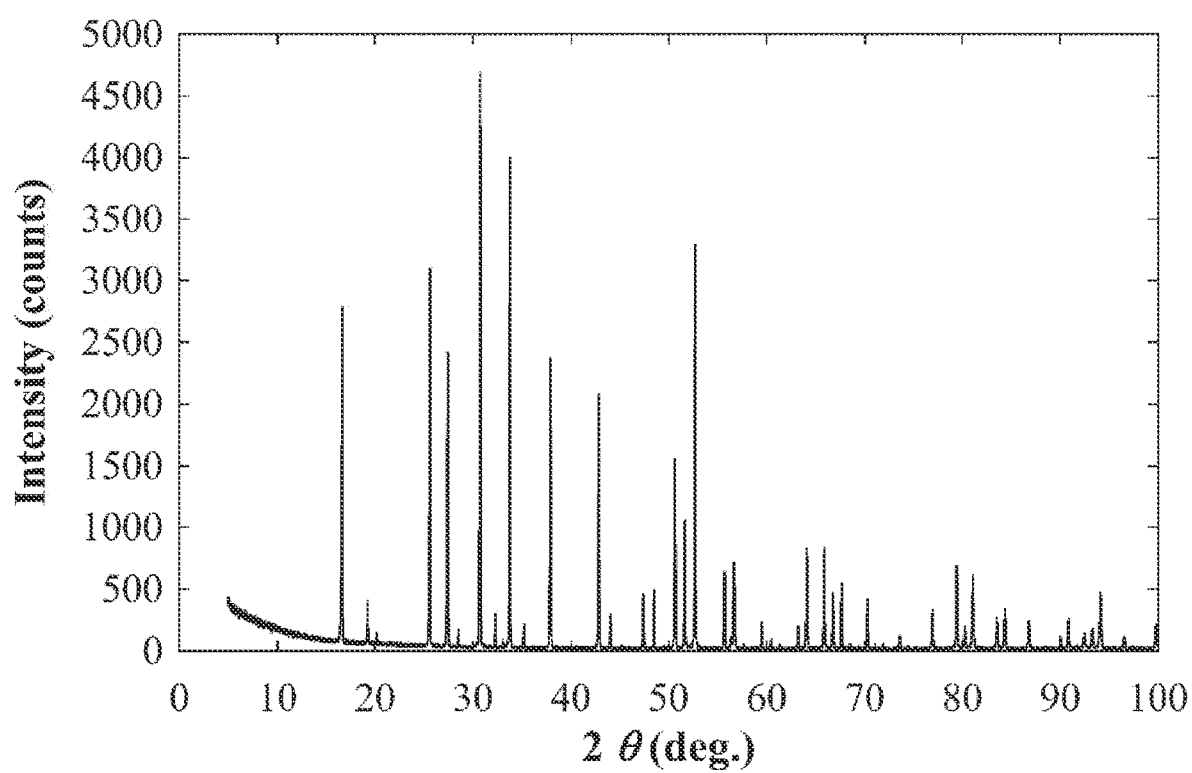
FIG. 11 is a powder X-ray diffraction pattern of a $Li_{6.64}Ga_{0.12}La_3Zr_2O_{12}$ single crystal obtained in an example.

The lattice constant a was worked out in accordance with a least squares method using the reflection observed in the single-crystal X-ray diffraction measurement of Sample 4; the result was a=1.2994 nm±0.0003 nm. This lattice constant indicated that Sample 4 was a lithium complex oxide having a garnet-type structure. Sample 4 was pulverized and subjected to a powder X-ray diffraction measurement; the results are illustrated in FIG. 11. The powder X-ray diffraction pattern of Sample 4 was similar to the single-phase diffraction pattern of a cubic garnet-type structure. The lattice constant a calculated from the results of powder X-ray structural analysis was a=1.29875 nm±0.00001 nm. Combining the results of the single-crystal X-ray diffraction measurement and the powder X-ray structural analysis, the lattice constant of Sample 4 is thus 1.29875 nm≤a≤1.2994 nm.

Figure 12:
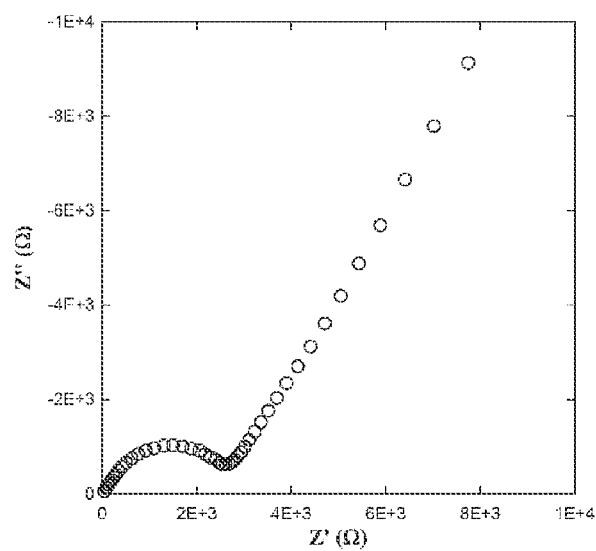
FIG. 12 is a Nyquist plot, in accordance with an AC impedance method, of a $Li_{6.64}Ga_{0.12}La_3Zr_2O_{12}$ single crystal obtained in an example.

Sample 4 was cut to produce a thin section having a diameter of about 0.70 cm and a thickness of about 0.10 cm. Electrodes were formed on the front and back of the thin section by sputtering of gold having a circular bottom surface with a 0.70 cm side, and having a thickness of 40 nm. The lithium ion conductivity of this sample was measured in accordance with an AC impedance method (measuring device: Solarton, 1260) at 25° C. in a nitrogen atmosphere, to yield the Nyquist plot illustrated in FIG. 12; the value calculated from the total resistance value was $2.9 \times 10^{-3}$ S/cm, which was ostensibly not different from that of the single crystal grown in accordance with the FZ method. Lithium ion conductivity was then calculated by modifying the measurement temperature in the AC impedance measurement, and the results were used to construct an Arrhenius plot on the basis of which activation energy was calculated, yielding a value of 0.22 eV that was not different from that of the single crystal grown in accordance with the FZ method.

Example 5

Production of All-Solid-State Lithium Ion Secondary Battery

Figure 13:
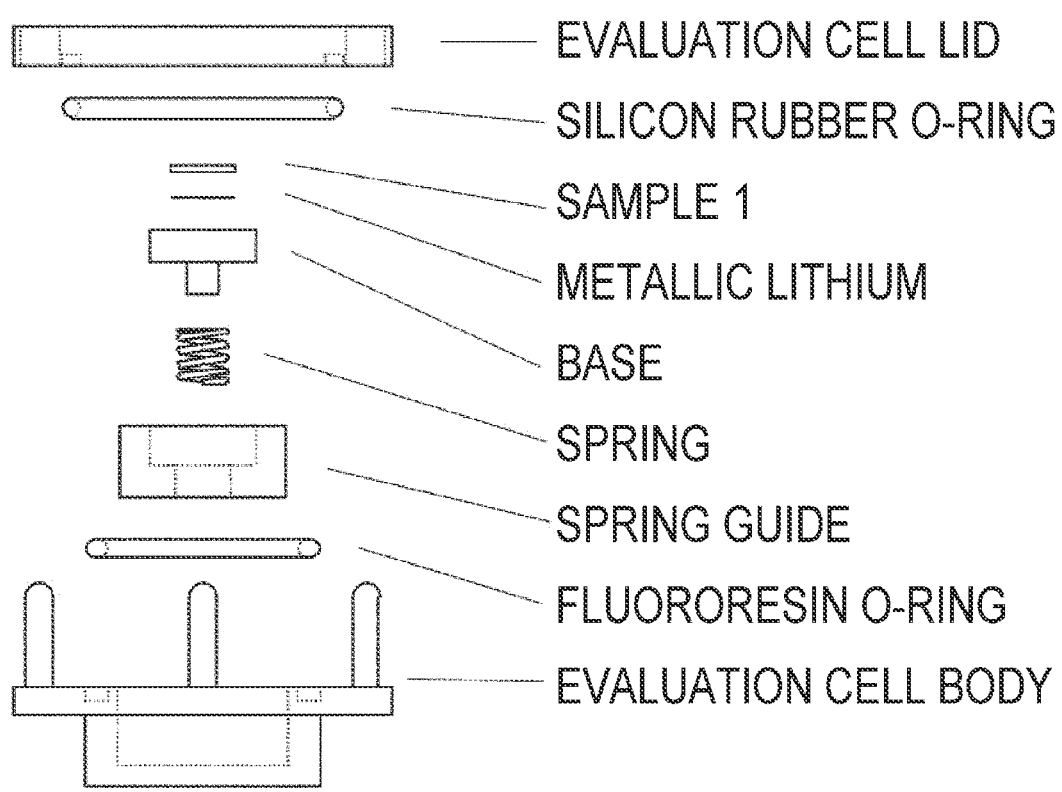
FIG. 13 is a schematic diagram of an all-solid-state lithium ion secondary battery produced in an example.

Herein 0.0105 moles of lithium acetate dihydrate (by Sigma-Aldrich) and 0.01 mole of cobalt acetate tetrahydrate (by Wako Pure Chemical Industries, Ltd.) were dissolved in 100 g of ethylene glycol (by Wako Pure Chemical Industries, Ltd.). Next, 10 g of polyvinylpyrrolidone K-30 (by Wako Pure Chemical Industries, Ltd.) were added and dissolved, to prepare a 0.1 mol/Kg lithium-cobalt oxide precursor solution. The amount of lithium acetate is set to be greater than the amount of cobalt acetate by 5%, in molar ratio, in anticipation of the evaporated lithium fraction at the time of firing. A thin section having a diameter of about 0.6 cm and a thickness of about 0.10 cm was produced by cutting Sample 1, whereupon 10 μL of the above solution were dropped on the thin section, and pre-firing was carried out at 400° C. for 20 minutes, followed by firing at 850° C. for 10 minutes, to synthesize thereby lithium cobaltate (hereafter also referred to as "Sample 2") as a positive electrode on the surface of Sample 1. As illustrated in FIG. 13, Sample 1 and metallic lithium punched to a diameter of 4 mm were placed in a commercially available HS cell for battery evaluation (by Hohsen Corp.), to prepare an all-solid-state lithium ion secondary battery. This all-solid-state lithium ion secondary battery exhibited an open circuit voltage of 2.8 V and thus proved to function as a battery.

INDUSTRIAL APPLICABILITY

The high-density $Li_{7-3x}Ga_xLa_3Zr_2O_{12}$ crystal of the present invention can be used for instance as a solid electrolyte material for an all-solid-state lithium ion secondary battery.

What is claimed is:

1. A solid electrolyte material, having a chemical composition represented by $Li_{7-3x}Ga_xLa_3Zr_2O_{12}$ (0.08≤x<0.5), a relative density of 99% or higher, belonging to space group I-43d in the cubic system, and having a garnet-type single crystal structure.

2. The solid electrolyte material of claim 1,
    wherein lithium ion conductivity is $2.0 \times 10^{-3}$ S/cm or higher.

3. The solid electrolyte material of claim 1,
    wherein the lattice constant a is 1.29714 nm≤a≤1.30433 nm.

4. The solid electrolyte material of claim 1,
    wherein lithium ions occupy the 12a site, the 12b site and two types of 48e site, and gallium occupies the 12a site and the 12b site, in the crystal structure.

5. The solid electrolyte material of claim 1,
    wherein the relative density is 100%.

6. A method for producing a solid electrolyte material having a chemical composition represented by $Li_{7-3x}Ga_xLa_3Zr_2O_{12}$ (0.08≤x<0.5), a relative density of 99% or higher, belonging to space group I-43d in the cubic system, and having a garnet-type single crystal structure, the method comprising: forming a molten portion through melting of at least part of a starting material the chemical composition whereof is represented by $Li_{(7-3x)} _y Ga_{xz}La_3Zr_2O_{12}$ (0.08≤x<0.5, 1.1≤y≤1.4, 1.6≤z≤3.3), and by causing the molten portion or a seed crystal to move, or causing a seed crystal to move relative to the molten portion, at a moving speed of 8 mm/h or higher.

7. The method for producing a solid electrolyte material of claim 6,
    wherein the moving speed is from 8 mm/h to 19 mm/h.

8. The method for producing a solid electrolyte material of claim 6,
    wherein in a case where the starting material having a rod shape is grown in accordance with the FZ method, the starting material is melted while being caused to rotate at a rotational speed of 30 rpm or higher in a plane perpendicular to a longitudinal direction.

9. The method for producing a solid electrolyte material of claim 8,
    wherein the rotational speed is from 30 rpm to 60 rpm.

10. The method for producing a solid electrolyte material of claim 6,
    wherein in the case of growth in accordance with the CZ method, a seed crystal is dipped in the molten portion and is pulled up while being caused to rotate at a rotational speed of from 3 rpm to 30 rpm.

11. An all-solid-state lithium ion secondary battery, having a positive electrode, a negative electrode, and a solid electrolyte,
    wherein the solid electrolyte is made up of the solid electrolyte material of claim 1.

* * * * *